TRANSISTOR SWITCHING CIRCUITS

Filed Nov. 15, 1956 4 Sheets-Sheet 1

INVENTOR.
HANNON S. YOURKE
BY
Alvin J. Riddles
AGENT

Dec. 13, 1960 H. S. YOURKE 2,964,652

TRANSISTOR SWITCHING CIRCUITS

Filed Nov. 15, 1956 4 Sheets-Sheet 3

2,964,652

TRANSISTOR SWITCHING CIRCUITS

Hannon S. Yourke, Poughkeepsie, N.Y., assignor to International Business Machines Corporation, New York, N.Y., a corporation of New York Filed Nov. 15, 1956, Ser. No. 622,307

18 Claims. (Cl. 307—88.5)

This invention relates to transistor switching circuits and in particular to transistor switching circuits wherein a transistor is operated in an essentially common base type of operation.

In the design and development of transistor switching circuitry, a number of limitations have been encountered which have an effect on the speed of operation of such circuits. These limitations arise from a number of sources, the more serious of which are the result of the wide range of characteristics which transistors may exhibit and the effect of both transistor and stray circuit capacitances. The phenomena of "Minority carrier storage," "Avalanche" and "Zener" breakdown of junctions, and the wide range of base to collector amplification factors, known in the art as $\alpha'$ of transistors, that must be considered in transistor circuit design are examples of problems encountered.

There are three principal types of operation known in the art for transistor circuitry, these are referred to as the common or grounded emitter type, the common or grounded base type and the common or grounded collector type of transistor circuitry. Each of these types of operation has advantages for particular applications and it has been discovered that the common base type of operation is superior to all others with respect to minimizing the above mentioned problems and ultimately to provide superior speed and reliability when used in switching circuits.

A discussion of the performance of the common or grounded base type of operation appears in the following references. Principles of Transistor Circuits, by R. F. Shea, published by J. Wiley & Sons, N.Y., 1953; Transistors and Other Crystal Valves, by T. R. Scott, published by MacDonald Evans Ltd., London, 1955; Fundamentals of Transistors, by L. M. Krugman, published by John F. Rider, N.Y., 1954; Transistors—Theory and Applications, by A. Coblenz and H. L. Owens, published by McGraw-Hill, N.Y., 1955.

What has been discovered is a principle of operation of transistor circuitry for switching applications where the advantages of the grounded base type of operation are utilized to provide a maximum of switching speed. This is accomplished by providing a transistor switching circuit having a common point to which is attached a constant current source. Multiple current paths are provided between the common point and the reference potential, each of which has an asymmetric impedance and at least one of which is a transistor. With this configuration a difference of potential may be applied between points in the paths to control the path through which the constant current flows.

A primary object of this invention is to provide an improved principle for the design of transistor switching circuits.

Another object is to provide an improved high speed transistor switching circuit.

Another object is to provide a transistor switching circuit system which operates on relatively small signals.

Still another object is to provide a transistor switching system wherein all elements are directly coupled.

Still another object is to provide a transistor switching system wherein the individual stages of the switching system are not interdependent with respect to loading.

Still another object is to provide a transistor switching system wherein the load on the power supplies is essentially constant.

A related object is to provide a transistor switching circuit using a minimum number of supply voltages.

Another related object is to provide a transistor switching system operating above cut off and below saturation.

Other objects of the invention will be pointed out in the following description and claims and illustrated in the accompanying drawings, which disclose, by way of example, the principle of the invention and the best mode, which has been contemplated, of applying that principle.

Figure 1:
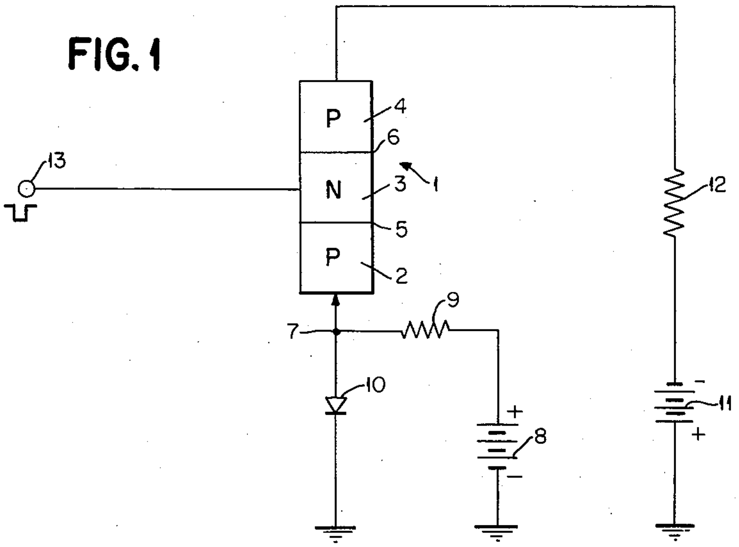
Figure 1 is a transistor switching circuit illustrating the principle of this circuit.

Referring now to Figure 1, a transistor circuit is shown illustrating the basic principle of the switching circuit of this invention. In Figure 1 a PNP junction transistor 1 is shown having an emitter 2, a base 3 and a collector 4 each separated by junctions 5 and 6, respectively. A common point 7 is provided in the circuit and a source of constant current illustrated as a battery 8 and resistor 9 in series is connected to this point. The emitter 2 of transistor 1 is connected to point 7 and an asymmetric impedance shown as a diode 10 is connected in the forward direction between the point 7 and a reference potential. The collector 4 of transistor 1 is connected to a negative potential shown as battery 11 through a load impedance illustrated as a resistor 12. Input terminal 13 is provided to permit impressing potential changes on the base 3 of transistor 1.

*Operation.*—In the no signal condition, the base 3 of transistor 1 is maintained positive with respect to the emitter 2, by connecting the input terminal 13 to a source of positive potential not shown and transistor 1 is cut off. The constant current applied to point 7 through the constant current generator, comprising battery 8 and resistor 9 in the no signal condition, flows through diode 10 to reference potential. When a negative input signal is impressed at terminal 13 of sufficient magnitude to remove the reverse bias from the emitter junction 5 the direction of constant current flow supplied to point 7 is changed so as to pass through the alternate path comprising transistor 1 and the load resistor 12 to the negative potential of battery 11. Under these conditions, the potential of point 7 becomes negative with respect to reference potential and the current flow through the first path diode 10 is cut off. At this time, the constant current supplied to point 7 by the constant current generator made up of battery 8 and resistor 9, flows entirely through the transistor and load. When the potential at the input terminal 13 returns to the no signal condition, the base 3 of the transistor 1 becomes positive with respect to the emitter 2 and junction 5 is again reverse biased, thereby cutting off conduction through transistor 1, changing the direction of the constant current flow at point 7 back through diode 10. It may be seen from the above discussion and Figure 1 that what is provided is a source of constant current delivered to a common point in a switching circuit and that multiple, shown here as two alternate paths, are provided connected to that common point, each of the alternate paths having asymmetric impedance and at least one of which is a transistor. Each path is then connected to a potential level such that a small variation between the potential level to which each path is connected would serve to change the direction but not the magnitude of the constant current supplied to the common point.

Through the use of this switching circuit principle a number of not immediately apparent advantages are achieved. The first of these advantages is that the transistor 1, which, for purposes of explanation will be referred to as the "switching transistor," is operated in what is known in the art as the common or grounded base type of circuit operation. The advantages of the common base type of operation are well known in the art and the Turn Off and Turn On performance of the transistor operated in such a circuit configuration is governed by time constants which are orders of magnitude shorter than those of all other types of operation currently available in the art. Thus, for an applied voltage switching signal applied to terminal 13, the charactertistics in Turn On and Turn Off of transistor 1 are governed by the time constants involved in the grounded base operation of a transistor. The grounded base type of operation here may be seen from the fact that the constant current is switched into the emitter of a transistor which is connected to a low impedance or voltage source at the base. Furthermore, as the voltage change at the emitter required is very small for this circuit the effects of capacitance at the emitter are very small. The transient behavior and the direct current behavior of the grounded base type of operation permits the circuit to be relatively independent of the "base to collector" amplification factor of the transistor. This factor is known in the art as $\alpha'$. Another advantage of the grounded base type of operation is that such a circuit has an inherent stability factor (known in the art as S that is close to "unity"). The stability factor is defined in the art as the effect of the back current through the collector junction on the circuit; and in circuit applications, this factor is expressed in terms of a ratio of the emitter resistance to the base resistance and consequently it is a measure of the input impedance that can be realized for the circuit. Since the transistor 1 may be closely controlled as to both the magnitude of reverse bias on the junction 5 at cut-off and the potential on the base 3 in conduction, neither "Turn On" delay due to an excessive reverse bias on junction 5 nor "Turn Off" delay due to minority carrier storage resulting from saturation is encountered. This is illustrated by the fact that the maximum negative voltage necessary to turn on the transistor is merely the forward voltage drop across the emitter zone and emitter junction. Similarly, the minimum positive voltage necessary to be applied to the base 3 of transistor 1 in order to turn off the circuit is the maximum forward potential drop across the diode 10. Since a constant current is supplied to point 7, both the maximum negative voltage and the minimum positive voltage necessary for operation may be very accurately established for the circuit. Further, the actual potential swing between these two maxima and minima as is well known in the semiconductor art is very small and therefore the circuit parameters in constructing a circuit involving the principle of this invention may be so selected that the transistor 1 operates at the optimum point on the characteristic curve for the type of switching operation desired. It will be also apparent to one skilled in the art that an additional advantage of the circuit of configuration of Figure 1 is that the reactive component associated with the distributed capacitance associated with the diode 10, upon the switching of the current path of point 7 to the transistor 1, discharges so as to aid in turning on transistor 1.

The above-described basic principle of this invention overcomes several limitations in the speed of transistor switching circuitry. A first advantage is that through the operation of the transistor as is performed by the method of this invention, saturation is avoided and thereby the phenomena of minority carrier storage and consequently "Turn Off" delay is minimized. Another advantage is that a circuit frequency response limitation imposed by the capacitance associated with the transistor and other portions of the circuit is minimized in that as the voltage swings handled by the circuit are small, little time is lost in charging and discharging of associated capacitance. Further, since the impedance levels of circuitry constructed according to the principle of this invention are low, the time constants associated with circuit capacitances are short. Another limitation that is minimized as a result of this type of operation is that the $\alpha'$ (base to collector amplification factor) of the transistor has little effect on the speed of operation of the circuit since in this type of operation the output is not dependent on the $\alpha'$ of the transistor but rather on the $\alpha$ (emitter to collector amplification factor) of the transistor. Therefore a wider range of transistors is available with this type of circuitry. The limitation due to the storage time in associated diode circuitry is eliminated, due to direct coupling of all elements, as will be explained in detail later.

The above-described basic principle and the advantages inherently flowing therefrom may be incorporated into a basic building block for logical circuitry wherein the diode 10 of Figure 1 may be replaced with a second grounded base transistor, resulting in a symmetric circuit wherein the complement of the logical function desired may be acquired as a by-product of the logic performed. An illustration of this type of basic building block is shown in Figure 2.

Figure 2:
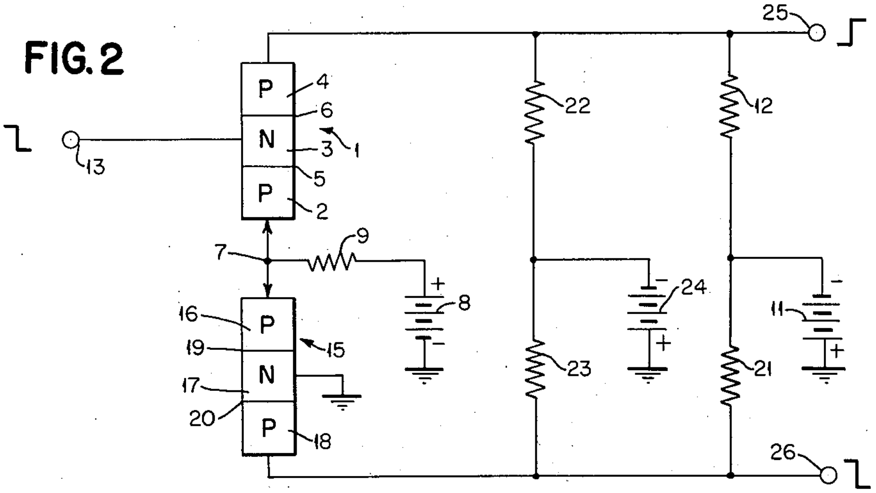
Figure 2 is a PNP complemented transistor switching circuit.

Referring now to Figure 2 wherein like elements with those of Figure 1 are given the same reference numerals, a transistor 1 is provided having an emitter 2, a base 3 and a collector 4, separated by junctions 5 and 6 respectively. The emitter 2 is connected to a common point 7 to which is supplied a constant current through battery 8 and a resistor 9, in series. A second current path is provided comprising a transistor 15 having an emitter 16, base 17 and a collector 18, separated by junctions 19 and 20, respectively. The base 17 of transistor 15 is connected to reference potential. The emitter 16 is connected to a common point 7. The collectors 18 and 4 are connected through a symmetrical load system whereby collector 4 is connected through resistor 12 to battery 11 and through resistor 22 to battery 24, similarly collector 18 is connected through resistor 21 to battery 11 and through resistor 23 to battery 24. Output terminals 25 and 26 are connected to collectors 4 and 18 respectively for signal sensing purposes as is well known in the art.

Operation.—In operation, current flows in the symmetrical load system from battery 11 in two parallel paths, the first of which being through resistor 21 and resistor 23, to battery 24 and the second of which being through resistors 12 and 22 to battery 24.

Under this condition current flows through the load system by virtue of a large difference of potential between batteries 11 and 24 so that switching performed between the active elements in the circuit namely transistors 15 and 1 serves merely to alter the magnitude or direction of this current. Assuming the potential at the base 3 of transistor 1 to be in a no signal condition which is such that conduction through transistor 1 is cut off, the constant current delivered to point 7 from battery 8 to resistor 9 flows through transistor 15 and affects the current flowing through resistors 23 and 21 of the load. Under these conditions a maximum positive potential level is established at terminal 26 and similarly a maximum negative value of potential is established at terminal 25. When a negative input signal sufficient in magnitude to overcome the reverse bias on junction 5 is impressed on terminal 13 conduction in transistor 1 is initiated and the direction of current flow supplied to point 7 changes from through transistor 15 to flow through transistor 1. This decreases the potential at point 7 slightly and reverse biases junction 19 of transistor 15 thereby cutting off conduction in transistor 15. The increment of current flow through transistor 1 is added to the current flow through the load system comprising resistors 12 and 22 thereby providing a potential shift at terminal 25 so as to raise the potential at that terminal an amount equivalent to the magnitude of the input signal. Similarly, in the alternate current path involving transistor 15, the cutting off of transistor 15 removes an increment of current that has been flowing in the load system comprising resistors 21 and 23, thereby reducing potential level at terminal 26.

It may now be seen that the circuit of Figure 2 is a very versatile building block. In it, direct current impedance levels may be low at all times in all parts of the circuit, delays due to circuit and transistor capacitance are maintained at a minimum. By the symmetrical aspects of such a building block as is described in Figure 2 the logic performed as a result of the switching function of the building block, appears as the direct logical operator at terminal 25 and the complement or denial of the logical operator appears at terminal 26. Thus, it should be noted that the structural features of the switching circuitry of this invention not only provide speed of operation but also in providing such speed achieve a powerful switching advantage of complementary logic.

The following specifications are provided as an illustration of the magnitude and direction of the parameters of the circuit of Figure 2, merely for the purpose of aiding in understanding and practicing the invention and to provide a basis for comparison of material to be presented later. The following specifications should not be construed as a limitation on such circuitry as it is well established in the art that a wide range of such specifications are available.

| | |
|---|---|
| Transistor 1 | PNP$\alpha$ cut off 5 mc. $\alpha>.95$—with a maximum of 0.4 volt, emitter to base voltage drop with 4 milliamperes' collector current and a minimum emitter to base breakdown voltage of 1.5 volts. |
| Transistor 15 | PNP$\alpha>.95\alpha$ cut off 5 mc.—with a maximum of 0.4 volt, emitter to base voltage drop with 4 milliamperes' collector current and a minimum emitter to base breakdown voltage of 1.5 volts. |
| Battery 8 | 41 volts. |
| Resistor 9 | 10K ohms. |
| Resistor 22 | 20K ohms. |
| Resistor 23 | 20K ohms. |
| Battery 24 | 44 volts. |
| Resistor 12 | 300 ohms. |
| Resistor 21 | 300 ohms. |
| Peaking coils | 5 microhenries—optional—one each to be inserted between resistor 12 and terminal 25 and between resistor 21 and terminal 26. |
| Battery 11 | 3 volts. |
| Input signal: | |
| No signal level | +0.6 volt. |
| Signal level | −0.6 volt. |
| Output signal at terminal 26: | |
| No signal level | −2.4 volts. |
| Signal level | −3.6 volts. |
| Output signal level at terminal 25: | |
| No signal level | −3.6 volts. |
| Signal level | −2.4 volts. |

Figure 3:
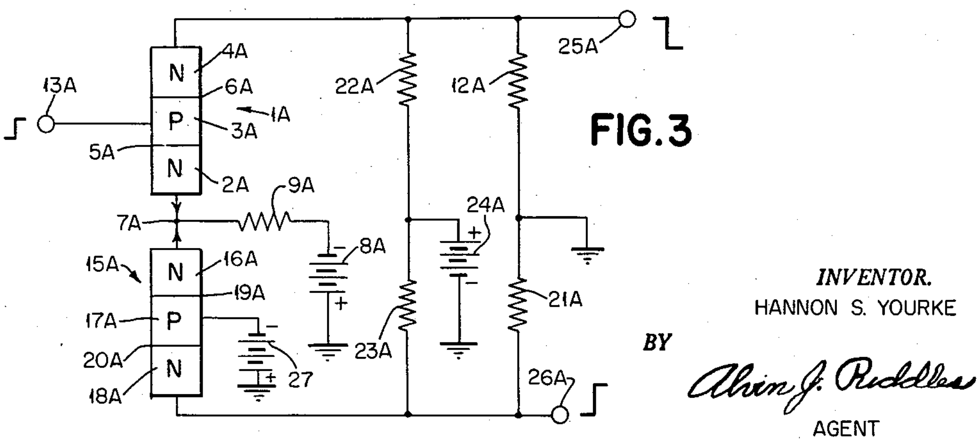
Figure 3 is an NPN complemented transistor switching circuit.

An equivalent embodiment of the building block of Figure 2, wherein opposite polarity pulses are handled through the use of NPN type transistors is shown in Figure 3. In this embodiment as in the embodiment of Figure 2, complementary type logic is available and all of the features found to be advantageous in the PNP type embodiment of Figure 2 are also present here.

Referring now to Figure 3, a constant current of proper direction for the type transistors being employed is delivered to a point 7A by battery 8A and resistor 9A, in series. A first current path is provided from point 7A through transistor 1A to the load impedance system comprising resistors 12A and 22A connected in series, between reference potential and battery 24A. Similarly, an alternate current path is provided through transistor 15A from point 7A to the load impedance system comprising resistors 21A and 23A connected in series between reference potential and battery 24A. It will be noted that the potential of the base 17A of transistor 15A in this NPN configuration is connected to an established negative potential shown as battery 27 and that the load impedance system is connected to reference potential rather than to a negative potential as was illustrated in Figure 2. This is accomplished for a potential shifting purpose which will be explained later, which serves to permit building blocks of the types of Figures 2 and 3 to be used in pairs such that the potential levels at the output terminals are of proper magnitude excursion to directly drive a subsequent logical block employing the opposite conductivity type transistors. With this arrangement and the fact that the complement of a particular signal is always available considerable logical versatility may be realized.

To aid in understanding and practicing the invention, the specifications of the circuit of Figure 3 are here provided for comparison purposes with the circuit of Figure 2 and the explanation of the operation will be undertaken from a slightly different viewpoint. As previously mentioned, it should be understood that the following set of specifications for the circuit of Figure 3, should not be construed as a limitation it being well established in the art that a wide range of such specifications are available in the art for such circuitry.

| | |
|---|---|
| Transistor 1A | NPN$\alpha$ cut off 5 mc. $\alpha>.95$—with a maximum of 0.4 volt, emitter to base voltage drop with 4 milliamperes' collector current and a minimum emitter to base breakdown voltage of 1.5 volts. |
| Transistor 15A | NPN$\alpha$ cut off 5 mc. $\alpha>.95$—with a maximum of 0.4 volt, emitter to base voltage drop with 4 milliamperes' collector current and a minimum emitter to base breakdown voltage of 1.5 volts. |
| Battery 8A | 44 volts. |
| Battery 24A | 41 volts. |
| Battery 27 | 3 volts. |
| Resistor 9A | 10K ohms. |
| Resistor 23A | 20K ohms. |
| Resistor 22A | 20K ohms. |
| Resistor 12A | 300 ohms. |
| Resistor 21A | 300 ohms. |
| Peaking coils | 5 microhenries—optional—one each to be inserted between resistor 12A and terminal 25 and resistor 21A and terminal 26. |
| Input pulse: | |
| No signal level | −3.6 volts. |
| Signal level | −2.4 volts. |
| Signal at terminal 26A: | |
| No signal level | −0.6 volt. |
| Signal level | +0.6 volt. |
| Signal level at terminal 25A: | |
| No signal level | +0.6 volt. |
| Signal level | −0.6 volt. |

*Operation.*—Referring to Figure 3 and to the above recited specifications for the NPN circuit shown in Figure 3, assume that the input signal in the no signal condition is at −3.6 volts. The transistor 15A will be conducting, and for a maximum potential difference across the conducting emitter 16A of 0.4 volt, the emitter 2A of transistor 1A will be reverse biased by 0.2 volt. Assuming, as above-described, a maximum potential difference across the conducting emitter 16A of 0.4 volt and a minimum drop of 0.2 volt and further assume an $\alpha'$, for transistors 15A and 1A, ranging from 20 to ∞ (infinity), the collector current of the conducting transistor 15A will vary approximately between the limits of 3.86 and 4.08 milliamperes, in addition to the back current ($I_{co}$) across the collector junction 20A. The collector current of transistor 1A while cut off, is $I_{co}$. When an input signal of +1.2 volts is impressed on terminal 13A, raising thereby the potential of the base 3A to −2.4 volts, transistor 1A will begin conduction, and considering a maximum potential difference across the conducting emitter 2A of 0.4 volt, the emitter 16A of transistor 15A would then be reverse biased by 0.2 volt. For the same tolerances as recited above, the collector current for transistor 1A will vary between the limits of 3.92 to 4.12 milliamperes plus the back current through the collector junction $I_{co}$. The collector current of transistor 15A under these conditions will be $I_{co}$. The variations of output currents described above are approximate due to the fact that variations due to resistor and power supply tolerances are not included. It will be apparent then, in the circuit of Figure 3, that the potential excursion of the collector 4A will be essentially equivalent to the potential excursion at the input terminal 13A and similarly, the potential excursion at the collector 18A will be the equivalent in complementary form of the potential excursion produced by the input signal of terminal 13A. In view of the fact that the common points of the load impedance system have been raised by a potential level of 3 volts, the potential level excursion of terminals 26A and 25A is now such as to be directly coupled to the input of a PNP type building block as illustrated in Figure 2. This fact may be seen by examination of the two sets of example specifications set forth for Figures 2 and 3.

The load system of this circuit and subsequent circuits to be described comprising resistors 12 and 22 and 21 and 23 and batteries 11 and 24 may be replaced by its Thevenin equivalent of a resistor returned to a battery. The loading system described is used so as to reduce the number of power supplies in a system wherein NPN and PNP type circuits are used and to minimize the effects of noise on the power supplies. Further, an inductive element known in the art as a "peaking coil" may be inserted in the load system in series with the smaller of the two resistors in each branch for purposes of compensating for shunt capacitance at terminals 25 and 26 and to provide a transient source of reverse current at the output at the time that either the transistor 1 or 15, or 1A or 15A is turned off. It should also be noted, looking at Figures 2 and 3, that by virtue of the complementary nature of these building block circuits that one side or the other being connected to a common power supply is always on and the load on all power supplies is therefore essentially constant, thus this greatly reduces the requirements on A.C. and D.C. voltage regulation for these supplies and noise is minimized throughout the system.

Building blocks of the types illustrated in Figures 2 and 3 may be provided with more than merely the two paths illustrated by introducing further switching transistors in separate paths between the common point and the reference potential so that the constant current through any particular one to the exclusion of the others may be controlled by a particular magnitude of the switching signal to that path.

Figure 4:
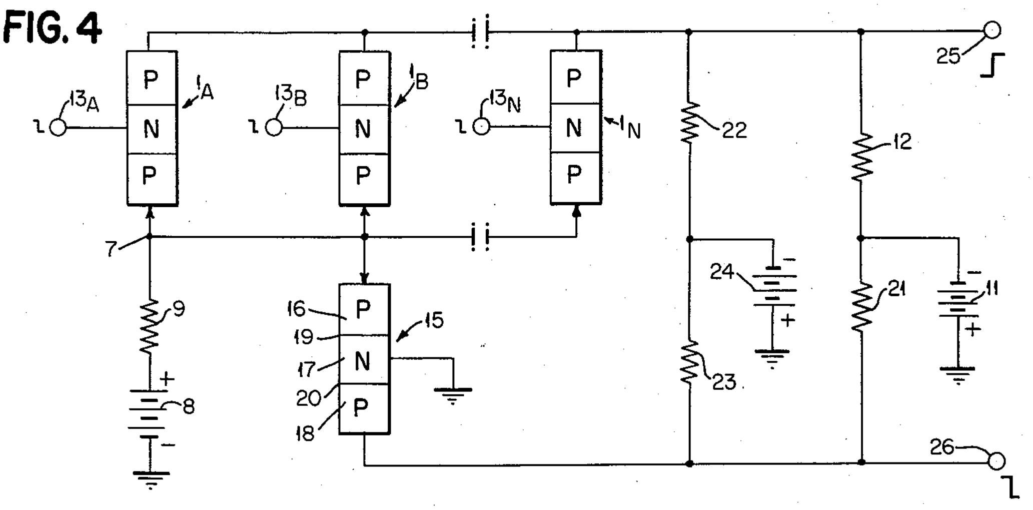
Figure 4 is an N way complemented OR switching circuit using PNP transistors.

The previously described principle of this invention exhibits considerable versatility and it may be seen that a wide range of logical switching circuits constructed along the lines of the circuits described in Figures 2 and 3 may be fabricated wherein a constant current is supplied to a common point, which current may be switched through one of several alternate paths to change a potential in a load system having controlled current flowing therein. As an example of one type of modification of the switching principle of this invention a logical circuit having a plurality of parallel paths making up one of the two alternate current directions is shown in Figure 4. This circuit is usable as an N way complement OR circuit. Referring now to Figure 4, like reference numerals have been applied to like elements, and a common point 7 is supplied by a constant current generator comprising a battery 8 and resistor 9 in series. A first current path is made up of a transistor 15 connected to a load system comprising resistors 23 and 21 and batteries 24 and 11, respectively, as previously described in connection with Figure 2. The alternate current path between point 7 and reference potential is made up of a number of branches shown in this illustration as transistors $1_A$, $1_B$ . . . $1_N$ each connected in parallel between point 7 and a load system comprising resistors 22 and 12, and batteries 24 and 11.

*Operation*.—In operation, the circuit of Figure 4 performs in a manner similar to that described for the circuits of Figures 2 and 3, wherein the constant current supplied to point 7 is switched alternately through one of two paths to reference potential. The first path comprising transistor 15 or the alternate path comprising transistors $1_A$, $1_B$ . . . $1_N$ in parallel. The load system made up of impedances 21, 22, 23 and 12 and batteries 11 and 24 function as previously described in the case of Figures 2 and 3. Under these conditions of operation, assuming transistors $1_A$, $1_B$ . . . $1_N$ "cut off" by virtue of having input terminals $13_A$, $13_B$ . . . $13_N$ connected to a no signal level that is positive with respect to point 7, constant current flows from point 7 through transistor 15 and influences the potential at output terminal 26, causing it to assume a maximum positive or no signal level value. Should a negative signal appear at any one or a combination of inputs $13_A$, $13_B$ . . . $13_N$, conduction will be initiated in at least one of transistors $1_A$, $1_B$ . . . $1_N$, and the constant current supplied to point 7 will be switched through one or more of transistors $1_A$, $1_B$ . . . $1_N$ thereby producing a positive potential excursion at output terminal 25, as previously described in connection with Figures 2 and 3. It will then be apparent that the logical operator "OR" symbolized "V," may be realized at output terminal 25 as a result of an input signal appearing at any one of the input terminals $13_A$, $13_B$ . . . $13_N$. Since the circuit of Figure 4 is a complemented circuit, it will then be apparent that at output terminal 26, the denial of the logical operator AND, symbolized "·," for the number of input variables appearing at terminals $13_A$, $13_B$ . . . $13_N$, will be realized. This may be seen from the fact that the potential level at the terminal 26 is only changed when the denial of all input variables appearing at terminals $13_A$, $13_B$ . . . $13_N$ are present. For example, the constant current applied to point 7 flows through transistor 15 if and only if no input variable appears at any of terminals $13_A$, $13_B$ . . . $13_N$. When an input variable appears at any one of these terminals the constant current supplied to point 7 is switched through the particular transistor associated with the input variable that is present and the potential level at terminals 26 and 25 move in opposite directions. Since complements are always available in circuits constructed along the lines of this invention, the N way complemented OR circuit of Figure 4 can perform all "AND" and "OR" operations on an N number of signals or their complements. It will be apparent to one skilled in the art that the use of NPN type transistors constructed along the lines illustrated in Figure 3 will permit a positive "AND" logical operator to be realized. In the circuit of Figure 4, if the complement is not required, transistor 15 may be replaced by a diode as illustrated in Figure 1 and under this condition only the logical operator "V" at terminal 25 will be realized.

Figure 5:
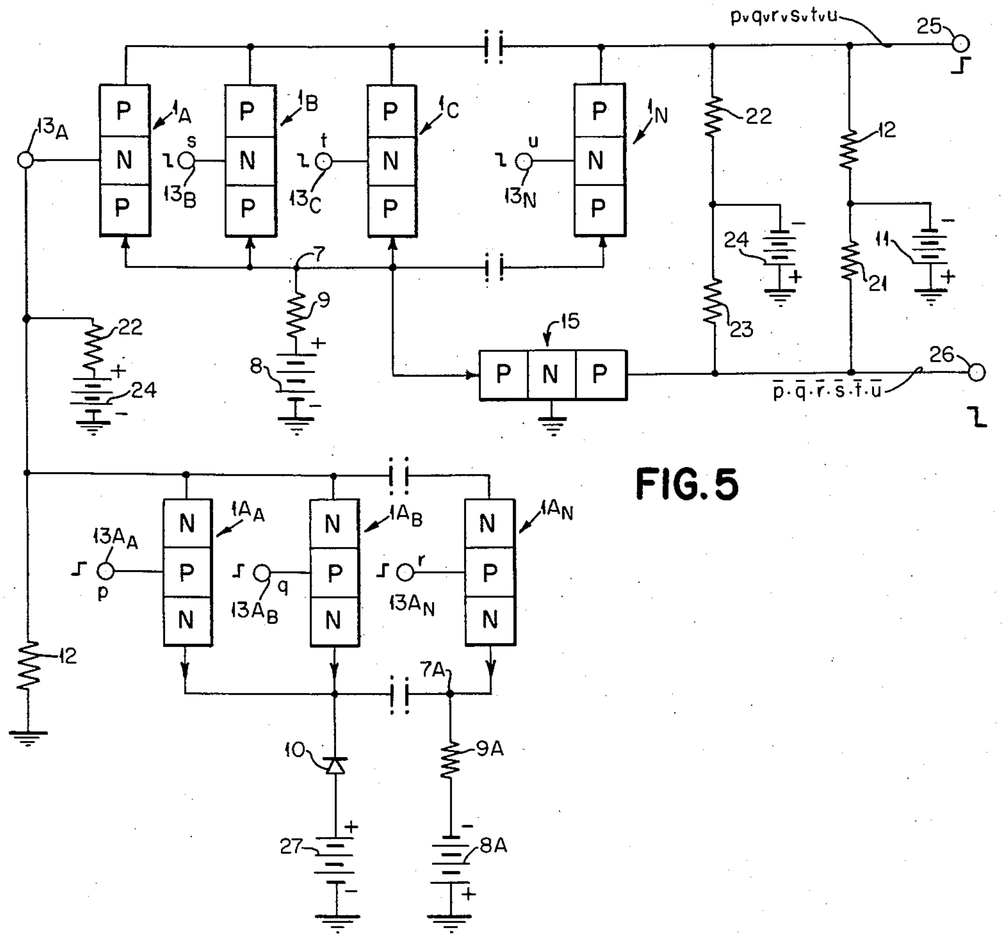
Figure 5 is an N way complemented OR switching circuit using NPN and PNP type transistors.

A further extension of the switching principle may be accomplished by coupling the circuits of Figures 2 and 3 together thereby facilitating the handling of opposite polarity switching pulses. In Figure 5 of this invention there is illustrated an N way complemented "OR" circuit employing transistors of more than one type. Once again, referring now to Figure 5, as in previous figures, like points have been given like reference numerals.

This circuit is an illustration of the manner in which blocks of circuitry as described above in connection with Figures 2 and 3 may be combined so as to provide a unitary logical circuit capable of achieving a particular complicated logical function. In this circuit a first switching circuit is provided comprising a constant current generator connected to a common point, and illustrated as being made up of battery 8A and resistor 9A connected to point 7A. Two alternate current paths to reference potential are provided, the first of which is through a diode 10 and battery 27 and the second of which is through one or more of a group of transistors designated as $1A_A$, $1A_B$ . . . $1A_N$ to a load system comprising a resistor 12 and a resistor 22 and battery 24. The signal appearing at the collectors of this branch of the circuit is applied to turn on one of a group of transistors providing an alternate path in a second switching circuit wherein PNP type conductivity transistors are used. The second block is constructed along the lines of Figures 2 and 4, whereas the first block is constructed along the lines of Figures 3 and 4.

*Operation.*—In operation, the portion of Figure 5 employing NPN type transistors is a positive pulse handling counterpart of the "OR" circuit as described in Figure 4, wherein in the no signal condition all three illustrated transistors $1A_A$, $1A_B$ . . . $1A_N$ are "cut off" and current flows from point $7_A$ to reference potential through diode 10 as described in Figure 1. Any one, or a plurality of positive signals appearing at point terminals $13A_A$, $13A_B$ . . . $13A_N$ sufficient to overcome reverse bias on the emitter of any one or a plurality of the transistors $1A_A$, $1A_B$ . . . $1A_N$ initiates conduction through this path and provides an inverted potential shift in the load system comprising resistors 12 and 22. This inverted potential shift is applied to one of a group of PNP transistors labelled $1_A$, $1_B$, $1_C$ . . . $1_N$, which provides one branch of an OR circuit corresponding to the type shown in Figure 4. Hence, assuming that the lettered designations for the variable inputs applied to the input terminals $13_A$ through $13_N$ and $13A_A$ through $13A_N$ are labelled *p*, *q*, *r*, *s*, *t*, and *u*, it will be apparent that at output terminal 25, the logical operator realized will be $pVqVrVsVtVu$ and at the same time at terminal 26 $\bar{p}\cdot\bar{q}\cdot\bar{r}\cdot\bar{s}\cdot\bar{t}\cdot\bar{u}$ will be realized. These two logical operators are part of a six variable input information system and are illustrative of the locial versatility of switching circuitry built along the principles of this invention. In copending application, Serial Number 611,922, filed September 25, 1956, and assigned to the assignee of this invention, the value of complicated logical functions such as the above two operators is explained.

Figure 6:
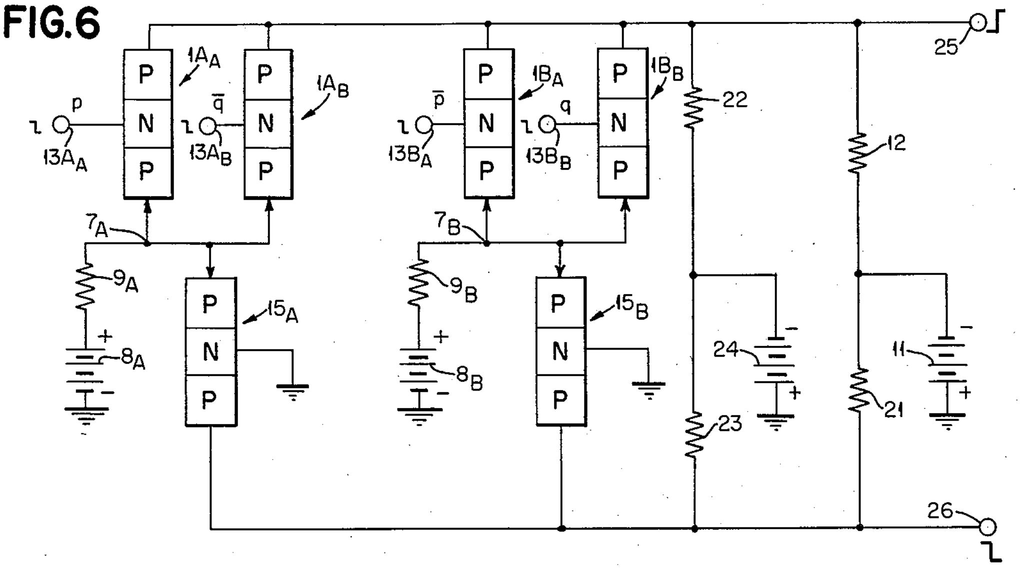
Figure 6 is a complemented switching circuit capable of realizing more than one logical function.

The principle of this invention may be further extended by coupling circuits of the types above described to a common load. Referring now to Figure 6 a complemented circuit is shown capable of achieving a plurality of logical functions and illustrating another manner in which circuits built along the principles of this invention may be connected and how a shift in operating level as a result of such combination can be employed to advantage. In Figure 6, a first logical circuit comprising a common point 7A supplied by a constant current generator, namely battery 8A and resistor 9A, is connected through one path, shown as transistor 15A to a load system comprising a battery 11, resistor 21, resistor 23 and a battery 24. An alternate path from point 7A through transistors $1A_A$ and $1A_B$ is provided connected to a complementary side of the load system comprising resistors 22 and 12 connected to batteries 24 and 11, respectively. An identical circuit is provided for a common point $7_B$ supplied by a constant current generator comprising battery $8_B$ and resistor $9_B$ wherein a first path is provided through transistor $15_B$ to one side of the above-described load system and an alternate path is provided through transistors $1B_A$ and $1B_B$ in parallel to the other side of the load system. In order to aid in understanding Figure 6, the following set of specifications are provided:

| | |
|---|---|
| Transistors $1A_A$, $1A_B$, $1B_A$, $1B_B$, $15_A$ and $15_B$ | PNP frequency cut off—5 mc. $a > .95$—with a maximum of 0.4 volt, emitter to base voltage drop with 4 milliamperes' collector current and a minimum emitter to base breakdown voltage of 1.5 volts. |
| Batteries $8_A$ and $8_B$ | 41 volts. |
| Resistors $9_A$ and $9_B$ | 10K ohms. |
| Resistor 23 | 20K ohms. |
| Resistor 22 | 6.8K ohms. |
| Resistors 12 and 21 | 300 ohms. |
| Battery 24 | 44 volts. |
| Battery 11 | 3 volts. |

*Operation.*—In the circuit of Figure 6 in the no signal condition, current supplied to points $7_A$ and $7_B$ flows through the PNP transistors $15_A$ and $15_B$ and produces a potential level at terminal 26, resulting from a flow of essentially four milliamperes through each making a total of 8 milliamperes through resistor 23, in addition to the current presently flowing in the load system, as previously described in connection with Figures 2 and 3. Under these conditions, the potential at terminal 26 is at its most positive level. Transistors $1A_A$, $1A_B$, $1B_A$ and $1B_B$ are all "cut off" by virtue of being connected to a potential sufficient to reverse bias the emitter junctions and therefore, the potential at terminal 25 is at its most negative level which level is established by the no signal current flowing through the branch of the load system comprising resistors 12 and 22 as previously described. Since the section of this circuit represented by transistors $1A_A$, $1A_B$ and $15_A$ is one "OR" circuit similar to the one described in connection with Figure 4 and a second section of this circuit comprising transistors $1B_A$, $1B_B$ and $15_B$ is another "OR" circuit of the type described in connection with Figure 4. The two "OR" circuits are connected in parallel so that a signal impressed upon either of the two control transistors of the "OR" circuit will be effective to switch the constant current supplied to that particular circuit. The value of resistor 22, as will be noted from the above table of specifications, has been so adjusted as to compensate for the fact that two of these logical blocks have been applied in parallel to a load system so that in the output signal produced as a result of a logical operation performed in combination of the two although it is the result of an increased quantity of current, the potential shift will be the same.

This type of coupling may be extended to any number of logical blocks which may be assembled in parallel to provide a single logical operator of an information system involving a high number of input variables and an adjustment in the load resistor values may be made so that the output signal excursions will be the value desired. Considering the input terminals $13A_A$, $13A_B$, $13B_A$ and $13B_B$ connected to two input variables and the denial thereof in such a manner that $13A_A$ is connected to the variable *p*, $13A_B$ is connected to the denial of *q*, symbolized $\bar{q}$, $13B_A$ is connected to the denial of *p*, symbolized $\bar{p}$, and $13B_B$ is connected to *q*.

Under these conditions, the circuit of Figure 6 will perform in the following manner. If both *p* and *q* are present, a total of 4 milliamperes will flow through transistor $1A_A$ and 4 milliamperes flow through transistor $1B_B$ resulting in a potential shift at output terminal 25 resulting from an increase of 8 milliamperes flowing through resistor 22 so that the output at terminal 25 is at its maximum positive value when both *p* and *q* are present. Whereas in this instance both transistors $15_A$ and $15_B$ are "cut off" and the output potential level at terminal 26 is at its most negative value. Under the condition where *p* is present and *q* is not present, the presence of $p$ turns on transistor $1A_A$ and the presence of a negative signal from $\bar{q}$ also turns on transistor $1A_B$, transistors $1B_A$ and $1B_B$ remaining cut off, these conditions cause the constant current supplied at point $7_A$ to deliver 4 milliamperes through resistor 22 and to subtract 4 milliamperes from the no signal condition current flowing through resistor 23, because transistor $15_A$ is now cut off. In other words, under these conditions, current flows through transistors $1A_A$ and $1A_B$ in the first "OR" circuit and through transistor $15_B$ in the second "OR" circuit. A potential shift resulting from a 4 milliampere current shift appears in one direction at terminal 25 and a similar potential shift resulting from a 4 milliampere current shift appears in the opposite direction at terminal 26. It may be seen by inspection that in the condition wherein $p$ is not present and $q$ is present that the "OR" circuit comprising $1B_A$ and $1B_B$ will be turned on by virtue of the presence of the denial of $p$ and presence of $q$ applied to terminals $13B_A$ and $13B_B$, transistor $15_B$ being "cut off." Whereas the "OR" circuit involving transistors $1A_A$ and $1A_B$ will be unchanged in that all no signal current supplied at point $7_A$ will continue to flow through transistor $15_A$. In this case, as in the previous case, a 4 milliampere current in addition to the no signal current in the load system results in potential excursions in opposite directions at terminals 25 and 26. In the condition where both $p$ and $q$ are not present the presence of $\bar{q}$ turns on transistor $1A_B$. Similarly, the presence of $\bar{p}$ turns on transistor $1B_A$ and the resulting potential excursions at terminal 25 and 26 are a result of an 8 milliampere change from the no signal condition. It will be apparent then, that at terminal 25 a large potential shift is observed for the conditions where $p$ and $q$ are present and for the condition where $p$ and $q$ are not present whereas a smaller potential shift is observed for the condition where either $p$ or $q$, but not both, is present. Similarly, at terminal 26 there will be no potential shift when both $p$ and $q$ are present and no potential shift when $p$ and $q$ are not present but there will be a potential shift as a result of a 4 milliampere signal when either $p$ or $q$ are present but not both.

This slight difference in potential swing in the case of terminal 25 between one condition and another, that is between 4 milliamperes and 8 milliamperes, can be made to produce the same output signal swing as between 0 milliamperes and 4 milliamperes by adjustment of the value of the load system as is accomplished by changing the value of resistor 22 as above illustrated in the specifications for the circuit of Figure 6, so that even though the heavier current flows, the potential swing at terminal 25 remains the same as that of terminal 26. The following truth table illustrates in tabular form the result of the above circuit.

| $p$ | $q$ | Signal at Terminal 25 | Binary Notation | Signal at Terminal 26 | Binary Notation |
|---|---|---|---|---|---|
| 1 | 1 | 8 milliamperes. | 1 | 0 | 0 |
| 1 | 0 | 4 milliamperes. | 0 | 4 | 1 |
| 0 | 1 | 4 milliamperes. | 0 | 4 | 1 |
| 0 | 0 | 8 milliamperes. | 1 | 0 | 0 |
| | | | ≡ Logical operator realized. | | ∀ Logical operator realized. |

It should be noted that through the introduction of a variable in the transistor of each of the alternate paths, other logical operators may be realized from the circuits of Figures 4, 5 and 6.

Figure 7:
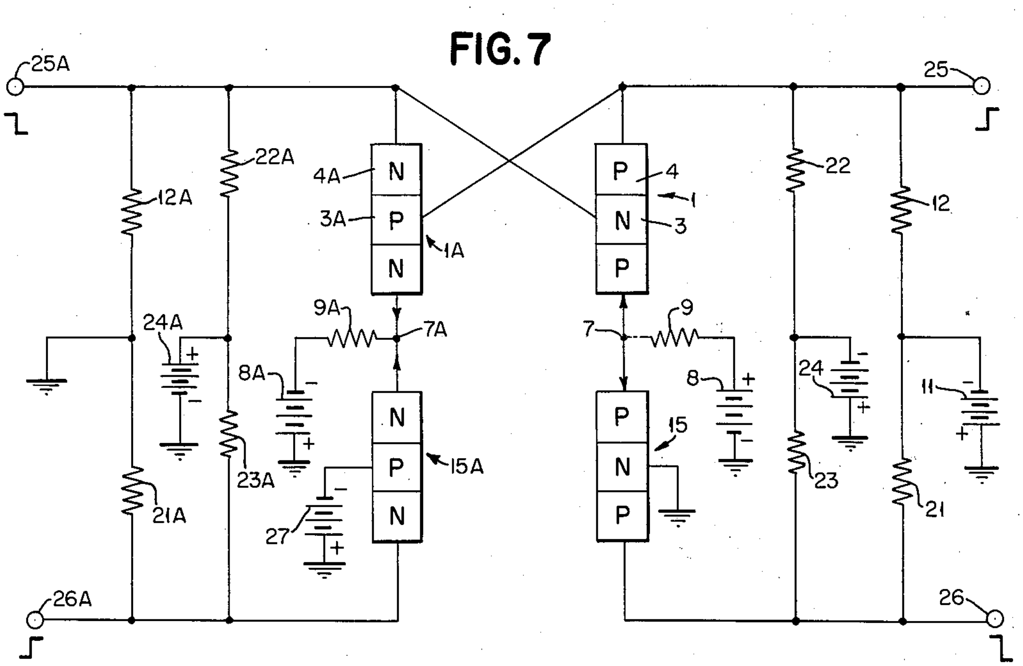
Figure 7 is one type of complemented transistor bistable circuit.
Figure 8:
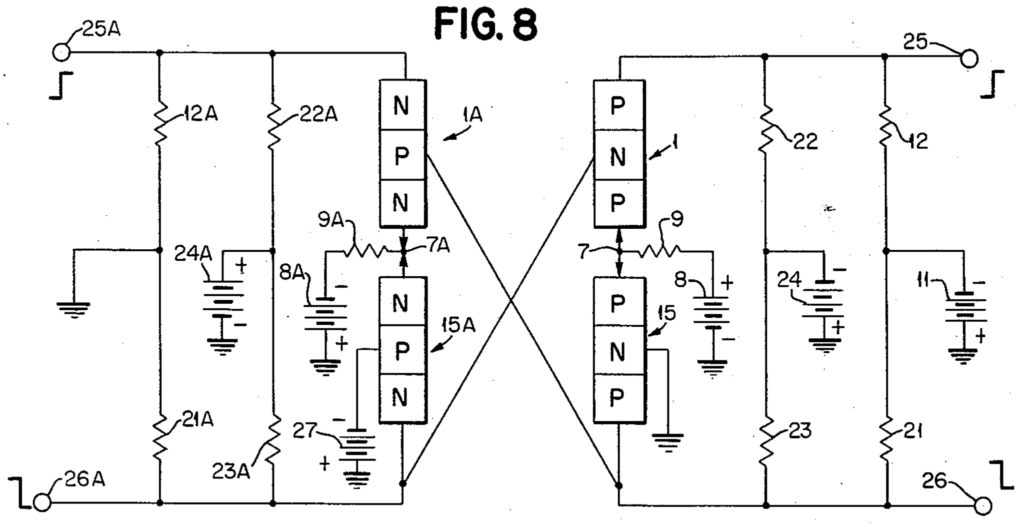
Figure 8 is another type of complemented transistor bistable circuit.
Figure 9:
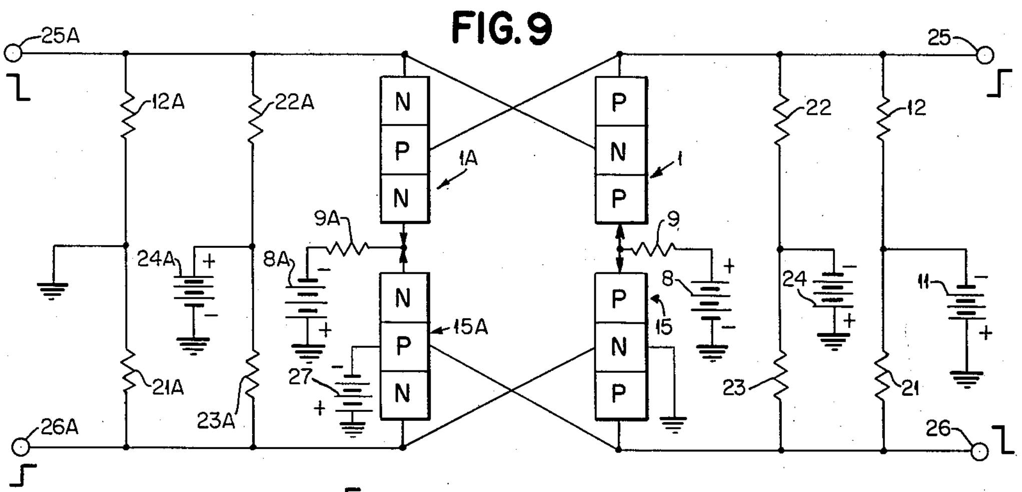
Figure 9 is a third type of complemented transistor bistable circuit.

In Figures 7, 8 and 9 several illustrations are shown of crosscoupling and feedback techniques wherein bistability is imparted to combinations of circuits built along the principles of this invention. In each of these circuits a PNP circuit, as in Figure 2, and an NPN circuit as in Figure 3 are crosscoupled so as to provide bistable circuits. In each of the circuits of Figures 7, 8 and 9, reference numerals identical with those of Figures 2 and 3 have been employed for simplification purposes and the operation of each branch is as described in connection with Figures 2 and 3.

Referring now to Figure 7, the alternate paths between points 7 and 7A and output terminals comprising transistors 1 and 1A have been crosscoupled so as to provide a bistable circuit wherein when conduction is initiated in either transistor 1 or transistor 1A, both transistor 1 and 1A are turned on and each tends to hold the other transistor in the On condition. This is accomplished by connecting the collector 4 of transistor 1 to the base 3A of transistor 1A and similarly connecting collector 4A of transistor 1A to the base 3 of transistor 1. This circuit may be turned on by turning on either transistor 1 or 1A and may be turned off by introducing a pulse of opposite polarity to the same point or by introducing a pulse of appropriate polarity to either of transistors 15 or 15A to switch conduction through either one of those transistors when such switching occurs the crosscoupling serves to switch conduction through the other of transistors 15 or 15A. The circuit, as illustrated in Figure 7 is commonly referred to in the art as a latch-type circuit, although with apprepriate gating circuitry, available in the art, not shown, binary triggering operations may be accomplished. In the circuit of Figure 7, in the no signal condition, current is flowing through both transistors 15 and 15A and the potential level at terminals 26 and 25A is at its most positive level, whereas the potential level at terminals 25 and 26A is at its most negative level. An input signal sufficient to cause transistor 1 or 1A to turn on, assuming for illustration purposes a negative pulse applied to the base 3 of transistor 1, has the effect of switching the constant current available at point 7 from through transistor 15 to through transistor 1 to the load. This provides a potential rise at terminal 25 and the collector of transistor 1 and a potential rise at this terminal is delivered as a positive potential by virute of the cross connection to the base 3A of transistor 1A, change sufficient to turn on transistor 1A which is an NPN type transistor. The collector of transistor 1A as it goes on will deliver a negative potential excursion through the crosscoupling to the base 3 of transistor 1 thereby holding it in conduction. It may be seen then that the circuit of Figure 7 is very stable and, as indicated from the above description, there are two states wherein these advantages of stability are equally present. Further, both the output signal and its complement are at all times available in the circuit.

Referring now to Figure 8, a bistable circuit is shown wherein a feedback loop is provided in which there is no voltage inversion. The absence of a voltage inversion has associated with it freedom from coupling energy in the opposite direction from that desired through transistor collector capacitances and consequently contributes greatly to the speed of operation in the circuit. In Figure 8, in the no signal condition, conduction is through transistor 15 and the potential at terminal 26 is at its most positive potential, this potential is crosscoupled to the base of transistor 1A placing it in conduction. The potential at the collector of transistor 15A under these conditions is at its most positive potential since transistor 15A is cut off and, this potential being crosscoupled to the base of transistor 1, holds transistor 1 out of conduction. Assuming for purposes of illustration, a negative input pulse applied to the base of transistor 1 sufficient to overcome the crosscoupling and turn on transistor 1. Transistor 1 in turning "On" causes transistor 15 to be "cut off" and a negative potential excursion at terminal 26 is applied through the crosscoupling to the base of transistor 1A causing it to be "cut off." When transistor 1A turns "off" transistor 15A goes "on" and a negative potential excursion appearing at terminal 26 is transmitted through the crosscoupling to the base of transistor 1 holding it "on." Thus it may be seen that the above crosscoupled circuit switches from one state to another with pulses of all the same polarity being transmitted around the crosscoupling.

Referring now to Figure 9, another crosscoupled circuit that is similar to Figure 7 is shown wherein the crosscoupling is not only provided between transistors 1 and 1A, as in Figure 7, but also between transistors 15 and 15A. In this figure as in Figure 7 two building blocks of the types of Figures 2 and 3 are provided in crosscoupled relationship so that the crosscoupling causes one building block to follow the other and as a result a potential triggering signal applied to the base of one transistor in one of the two alternate paths in either building block would tend to cause the bistable circuit to change state, and to hold itself in the newly assumed state. The crosscoupling in Figure 9 is applied to both alternate paths and provides a bistable circuit such as would be advantageous under conditions where logical noise and unstable reference potential were prone to cause trouble in switching circuitry. In Figure 9, in addition to the crosscoupling holding transistors 1 and 1A in either of the two stable states, as described in connection with Figure 7, the added crosscoupling between transistors 15 and 15A operates to hold these transistors in the opposite state from transistors 1 and 1A. This circuit is very stable in each state it requires a substantial signal to provide a change of state.

In a practical application of this invention a condition may be encountered wherein the driving building block and the driven building block are physically located remote from each other so that noise may appear on certain power supply lines which could interfere with operation. To overcome this condition the circuit of Figure 10 is provided wherein certain parts of the load on a driving building block are transferred to the input of a driven building block when these elements are physically separated in use.

Figure 10:
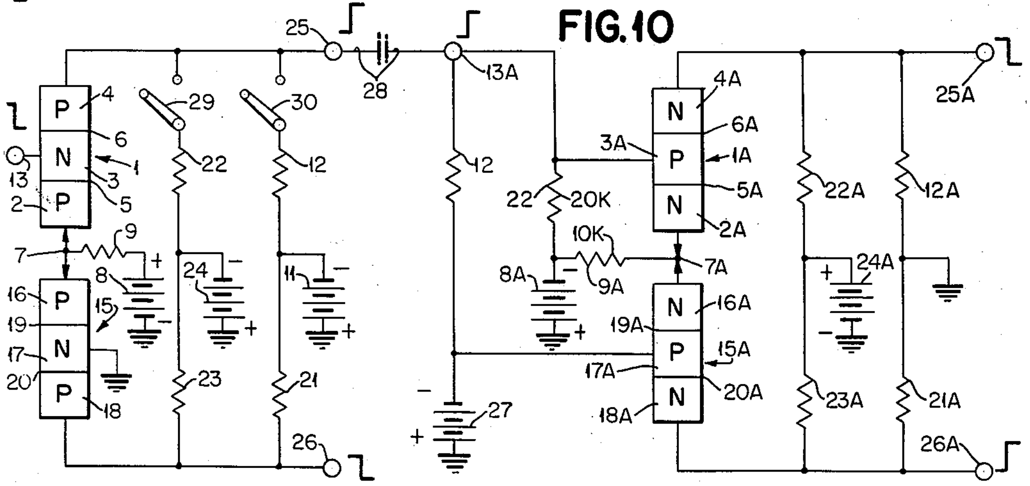
Figure 10 is an illustration of a coupling technique for transistor switching circuits of this invention.

Referring now to Figure 10 a physically long connecting lead is shown from terminal 25 of a PNP type building block as in Figure 2 to the input terminal 13A of an NPN type building block as in Figure 3. A duplicate load system of a PNP type building block is provided connected to the input terminal 13A. This system comprises a resistor 12 connected from terminal 13A to the potential of the base of transistor 15A, and a resistor 22 connected from terminal 13A to the driving potential of the constant current source namely battery 8A. In employing the above coupling arrangement the load system of the driving building block is disconnected.

It will be apparent that as a result of the symmetry of the logical switching system under description the potential sources shown as batteries 8 and 24A are the same value, potential sources shown as batteries 8A and 24 are the same value, and the potential sources shown as batteries 11 and 27 are the same value and hence fewer potential sources are needed and the effects of noise on these sources will thereby be kept to a minimum. In Figure 10 the load system of the driving building block, shown here for illustration as a PNP type block as in Figure 2, is disconnected as by opening switches 29 and 30 so that the collector of transistor 1 is directly connected to input terminal 13A of the driven block shown here as an NPN type block. The load resistors 22 and 12 are connected between input terminal 13A and equivalent potential sources 8A and 27 so that the load for transistor 1 of the driving block is located at the input of the driven block and most of the noise appearing on the load potential source also appears on the bias source of the alternate path of the next stage since these two sources are the same, namely, battery 27.

What has been described is a switching circuit principle and a logical switching system made therefrom wherein in each circuit multiple paths are provided between a common point in the circuit and a reference potential. A constant source of current is supplied to this common point and at all times current flows in one of the several paths. Logic may be performed by introducing one or a plurality of signals into the circuit operable to interrupt current flow through one path and to initiate it through another path. This principle then permits systems to be constructed wherein a number of building blocks each incorporating the alternate current path configuration may be coupled in groups.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the following claims.

What is claimed is:

1. A transistor switching circuit comprising in combination at least one constant current source, a reference potential and for each said constant current source a plurality of current paths connected between said reference potential and each said constant current source, each of said paths having asymmetric impedance connected in the forward direction, at least one of said paths comprising a transistor and each said constant current flowing at all times in at least one of said paths between each said constant current source and said reference potential.

2. A transistor switching circuit comprising a plurality of asymmetric impedance paths, the forward direction of at least one of which is from the emitter to the collector of a transistor, a source of constant current, means connecting said source of constant current to each of said paths, means operable to cause said current flow at all times through at least one of said paths and current sensing means associated with at least one of said paths.

3. A transistor switching circuit comprising a source of constant current, a source of reference potential, and a plurality of asymmetric impedance current paths connected in the forward direction between said current source and said reference potential, at all times at least one of which is carrying said constant current and at least one of which is the path from emitter to collector of a transistor.

4. A transistor switching circuit comprising in combination a common point, a source of constant current, means connecting said source of constant current to said common point, a reference potential, a plurality of asymmetric impedance current paths connected in the forward direction between said common point and said reference potential at least one of said paths being from emitter to collector of a transistor, means operable to cause said constant current to flow at all times through at least one of said paths and sensing means associated with at least one of said paths.

5. A transistor switching circuit comprising in combination a common point, a reference potential, a source of constant current, means connecting said constant current source to said common point, a first asymmetric impedance path comprising at least one transistor each having emitter, base and collector connections and having the emitter thereof connected to said common point, a first load impedance having one terminal thereof connected to said reference potential and having the remaining terminal thereof connected to said first asymmetric impedance path including the collector connection of said at least one transistor, a second asymmetric impedance path, a second load impedance having one terminal thereof connected to said reference potential, means connecting said second asymmetric impedance path in the forward direction between the remaining terminals of said second load impedance and said common point and means associated with said first asymmetric impedance path operable to control current therethrough.

6. The circuit of claim 5 wherein said second path is a grounded base transistor.

7. A transistor switching circuit comprising a common point, a reference potential, a constant current source, means connecting said common point to said constant current source, a first transistor having emitter, base and collector connections having the emitter thereof connected to said common point, a first load impedance having one terminal thereof connected to said reference potential and having the remaining terminal thereof connected to said collector connection of said first transistor, a second transistor having emitter, base and collector connections having the emitter thereof connected to said common point, a second load impedance having one terminal thereof connected to said reference potential and having the remaining terminal thereof connected to said collector connection of said second transistor, means establishing the base connection of said second transistor at a potential sufficient to establish conduction therethrough and signal input means associated with the base connection of said first transistor operable to control current flowing therethrough.

8. The circuit of claim 7 wherein said transistors are NPN type junction transistors.

9. The circuit of claim 7 wherein said transistors are PNP type junction transistors.

10. A logical circuit comprising in combination a common point, a reference potential, a source of constant current, means connecting said source of constant current to said common point, a first asymmetric impedance path connected between said common point and said reference potential, comprising a plurality of branches, each branch including the path between emitter and collector of a separate transistor, a second asymmetric impedance path connected in the forward direction between said common point and said reference potential and signal means associated with the base connection of the transistor of each of said branches and operable to control current flowing through said transistor.

11. The logical circuit of claim 10 wherein said transistors are PNP type junction transistors.

12. The logical circuit of claim 10 wherein said transistors are NPN type transistors.

13. A logical circuit comprising in combination a first load impedance having one terminal thereof connected to a reference potential; a second load impedance having one terminal thereof connected to said reference potential; a first logical section comprising in combination a first common point, a source of constant current, means connecting said source of constant current to said first common point, a first asymmetric impedance path connected between said first common point and the remaining terminal of said first load impedance, comprising a plurality of branches, each branch including the path between emitter and collector of a separate transistor, a second asymmetric impedance path connected in the forward direction between said first common point and the remaining terminal of said second load impedance and signal means associated with the base connection of the transistor of each of said branches and operable to control current flowing through said transistor; and a second logical section comprising in combination a second common point, a source of constant current, means connecting said source of constant current to said second common point, a first asymmetric impedance path connected between said second common point and the remaining terminal of said first load impedance and comprising a plurality of branches, each branch including the path between emitter and collector of a separate transistor, a second asymmetric impedance path connected in the forward direction between said second common point and the remaining terminal of said second load impedance and signal means associated with the base connection of the transistor of each of said branches and operable to control current flowing through said transistor.

14. The logical circuit of claim 13 wherein said transistors are PNP type transistors.

15. The logical circuit of claim 13 wherein said transistors are NPN type transistors.

16. A logical switching system comprising a plurality of interconnected first and second types of logical switching circuits; said first type of logical switching circuit comprising in combination a first common point, a first reference potential, a first constant current source, means connecting said first common point to said first constant current source, a first PNP type junction transistor having emitter, base and collector connections having the emitter thereof connected to said first common point, a first type logical circuit first load impedance having one terminal thereof connected to said first reference potential and having the remaining terminal thereof connected to said collector connection of said first PNP junction transistor, a second PNP type junction transistor having emitter, base and collector connections having the emitter thereof connected to said first common point, a first type logical circuit second load impedance having one terminal thereof connected to said first reference potential and having the remaining terminal thereof connected to said collector connection of said second PNP junction transistor, means establishing the base connection of said second PNP junction transistor at a potential sufficient to establish conduction therethrough and signal input means associated with the base connection of said first PNP type junction transistor operable to control current flowing therethrough, said second type of logical switching circuit comprising in combination a second common point, a second reference potential, a second constant current source, means connecting said second common point to said second constant current source, a first NPN type junction transistor having emitter, base and collector connections and having the emitter thereof connected to said second common point, a second type logical switching circuit first load impedance having one terminal thereof connected to said second reference potential and having the remaining terminal thereof connected to said collector connection of said first NPN type junction transistor, a second NPN type junction transistor having emitter, base and collector connections and having the emitter thereof connected to said second common point, a second type logical circuit second load impedance having one terminal thereof connected to said collector connection of said second NPN type junction transistor, means establishing the base connection of said second NPN type junction transistor at a potential sufficient to establish conduction therethrough and signal input means associated with the base connection of said first NPN type junction transistor and operable to control current flowing therethrough; a potential relationship between said first and said second reference potentials, such that said first reference potential is equal to said means establishing conduction through said second NPN type junction transistor and said second reference potential is equal to said means establishing conduction through said second PNP type junction transistor; and coupling means operable to apply signals appearing across said first and second load impedances of a particular one type of said first and second types of logical switching circuits to said signal input means of the other type of said first and second types of logical switching circuits.

17. A bistable transistor switching circuit comprising in combination a first section including a first common point, a first reference potential, a first constant current source, means connecting said common point to said first constant current source, a first PNP type junction transistor having emitter, base and collector connections having the emitter thereof connected to said common point, a first section first load impedance having one terminal thereof connected to said reference potential and having the remaining terminal thereof connected to said collector connection of said first type PNP junction transistor, a second PNP type junction transistor having emitter, base and collector connections having the emitter thereof connected to said first common point, a first section second load impedance having one terminal thereof connected to said first reference potential and having the remaining terminal thereof connected to said collector connection of said second PNP type junction transistor and biasing means operable to cause said constant current from said first source to flow through said second PNP type junction transistor; a second section including a second common point, a second reference potential, a second constant current source, means connecting said second common point to said second constant current source, a first NPN type junction transistor having emitter, base and collector connections having the emitter thereof connected to said second common point, a second section first load impedance having one terminal connected to said second reference potential and having the remaining terminal thereof connected to said collector connection of said first NPN type junction transistor, a second NPN type junction transistor having emitter, base and collector connections having the emitter thereof connected to said second common point, a second section second load impedance having one terminal thereof connected to said second reference potential and having the remaining termial thereof connected to said collector connection of said second NPN type junction transistor, and biasing means operable to cause said constant current from said second source to flow through said second NPN type junction transistor; and means crosscoupling the collector of said first PNP type junction transistor to the base of said first NPN type junction transistor and means crosscoupling the collector of said first NPN type junction transistor to the base of said first PNP type junction transistor.

18. A bistable transistor switching circuit comprising in combination a first section including a first common point, a first reference potential, a first constant current source, means connecting said common point to said constant current source, a first PNP type junction transistor having emitter, base and collector connections having the emitter thereof connected to said first common point, a first section first load impedance having one terminal thereof connected to said reference potential and having the remaining terminal thereof connected to said collector connection of said first type PNP junction transistor, a second PNP type junction transistor having emitter, base and collector connections having the emitter thereof connected to said first common point, a first section second load impedance having one terminal thereof connected to said first reference potential and having the remaining terminal thereof connected to said collector connection of said second PNP type junction transistor and biasing means operable to cause constant current from said first source to flow through said second PNP type junction transistor; a second section including a second common point, a second reference potential, a second constant current source, means connecting said second common point to said second constant current source, a first NPN type junction transistor having emitter, base and collector connections having the emitter thereof connected to said second common point, a second section first load impedance having one terminal connected to said second reference potential and having the remaining terminal thereof connected to said collector connection of said first NPN type junction transistor, a second NPN type junction transistor having emitter, base and collector connections having the emitter thereof connected to said second common point, a second section second load impedance having one terminal thereof connected to said second reference potential and having the remaining terminal thereof connected to said collector connection of said second NPN type junction transistor and biasing means operable to cause constant current from said second source to flow through said second NPN type transistor; and means crosscoupling the collector of said second PNP type transistor to the base of said first NPN type transistor; and means crosscoupling the collector of said second NPN type transistor to the base of said first PNP type transistor.

References Cited in the file of this patent

UNITED STATES PATENTS

| | | |
|---|---|---|
| 2,535,303 | Lewis | Dec. 26, 1950 |
| 2,535,377 | Titterton | Dec. 26, 1950 |
| 2,597,796 | Hindall | May 20, 1952 |
| 2,641,717 | Toth | June 9, 1953 |
| 2,710,348 | Baum et al. | June 7, 1955 |
| 2,730,632 | Curtis | Jan. 10, 1956 |
| 2,825,821 | Logue | Mar. 4, 1958 |
| 2,882,423 | MacSorley | Apr. 14, 1959 |